United States Patent
Hedler et al.

(10) Patent No.: US 8,048,479 B2
(45) Date of Patent: Nov. 1, 2011

(54) METHOD FOR PLACING MATERIAL ONTO A TARGET BOARD BY MEANS OF A TRANSFER BOARD

(75) Inventors: Harry Hedler, Germering (DE); Roland Irsigler, München (DE); Volker Lehmann, München (DE); Judith Lehmann, legal representative, München (DE)

(73) Assignee: Qimonda AG, Munich (DE)

( * ) Notice: Subject to any disclaimer, the term of this patent is extended or adjusted under 35 U.S.C. 154(b) by 363 days.

(21) Appl. No.: 11/496,724

(22) Filed: Aug. 1, 2006

(65) Prior Publication Data

US 2008/0029849 A1   Feb. 7, 2008

(51) Int. Cl.
*B05D 5/12* (2006.01)
*B05D 1/18* (2006.01)
*B23K 31/00* (2006.01)
*H01L 23/48* (2006.01)

(52) U.S. Cl. ...... 427/96.1; 427/97.7; 427/98.4; 427/430.1; 257/778; 228/180.1; 228/180.22

(58) Field of Classification Search ...... 427/96, 427/97.7, 98.4, 256, 294, 430.1; 228/180.1, 228/180.22, 256; 257/778
See application file for complete search history.

(56) References Cited

U.S. PATENT DOCUMENTS

| 5,834,062 A * | 11/1998 | Johnson et al. ............. 427/58 |
| 5,899,376 A * | 5/1999 | Tatumi et al. ............. 228/223 |
| 6,136,047 A * | 10/2000 | Karasawa et al. ............. 29/25.01 |
| 6,531,025 B1 * | 3/2003 | Lender et al. ............. 156/277 |
| 6,812,549 B2 | 11/2004 | Umetsu et al. |
| 7,829,380 B2 * | 11/2010 | Irsigler et al. ............. 438/108 |
| 2002/0094604 A1 | 7/2002 | Hayama et al. |
| 2002/0100972 A1 * | 8/2002 | Kitajima et al. ............. 257/734 |
| 2003/0000084 A1 * | 1/2003 | Bourrieres et al. ............. 29/852 |
| 2005/0035453 A1 * | 2/2005 | Ho et al. ............. 257/739 |

FOREIGN PATENT DOCUMENTS

| EP | 1 329 949 A2 | 7/2003 |
| EP | 1 655 389 A1 | 5/2006 |
| JP | 3138942 | 6/1991 |
| JP | 11-298138 | 10/1999 |
| JP | 2001-060654 | 3/2001 |
| JP | 2002-270718 | 9/2002 |
| JP | 2003-218200 | 7/2003 |

(Continued)

OTHER PUBLICATIONS

Examination Report mailed on Feb. 27, 2007, for German Patent Application No. 10-2006-035-865.

(Continued)

*Primary Examiner* — Brian K Talbot
(74) *Attorney, Agent, or Firm* — Patterson & Sheridan, LLP

(57) ABSTRACT

A method for placing material onto a target board by means of a transfer board comprising a plurality of blind holes, the method comprising the steps of immersing the transfer board in a material bath, wherein a first pressure acts on the material bath and a second pressure acts in the blind holes, and wherein the first pressure and the second pressure are substantially equal; generating a pressure difference between the first pressure and the second pressure, so that the blind holes of the transfer board are filled at least partially with the liquid material; extracting the transfer board from the material bath; and positioning the transfer board opposite to the target board, the material being expelled from the blind holes, such that the material touches the target board.

21 Claims, 13 Drawing Sheets

FOREIGN PATENT DOCUMENTS

JP            2004-296488        10/2004

OTHER PUBLICATIONS

Satoh, Akinobu (2001). "Wiring of Bumpless, Three-dimensional Integrated Si Wafers Block Using Through-hole Interconnections," Jpn.J. Appl. Phys. 40(8):4474-4780.

Buetow, M. "IBM Updates C4 Flip Chip Concept," located at <http://circuitassembly.com/cms/index2.php?option=com_content&task=view&id=1840&Itemid=95&p...>visited on Jul. 25, 2005. (1 page).

Gruber, P. A. et al. (2005). "Low-cost Wafer Bumping," *IBM J. Res. & Dev.* 49(4/5):621-639.

Lehmann, V. (1993). "The Physics of Macropore Formation in Low Doped n-Type Silicon," *J. Electrochem. Soc.*, 140(10):2836-2843.

Lehmann, V. et al. (2002). "MEMS Techniques Applied to the Fabrication of Anti-scatter Grids for X-ray Imaging," *Sensors & Actuators A* 95:202-207.

Translation of Japanese Examination Report dated Aug. 4, 2009.

\* cited by examiner

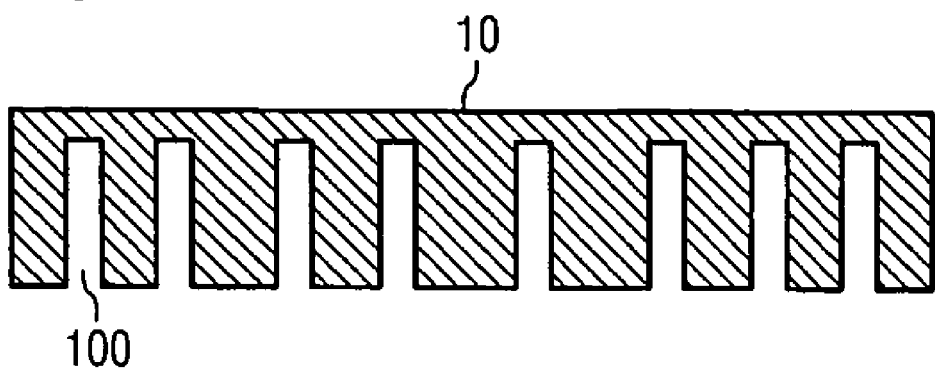
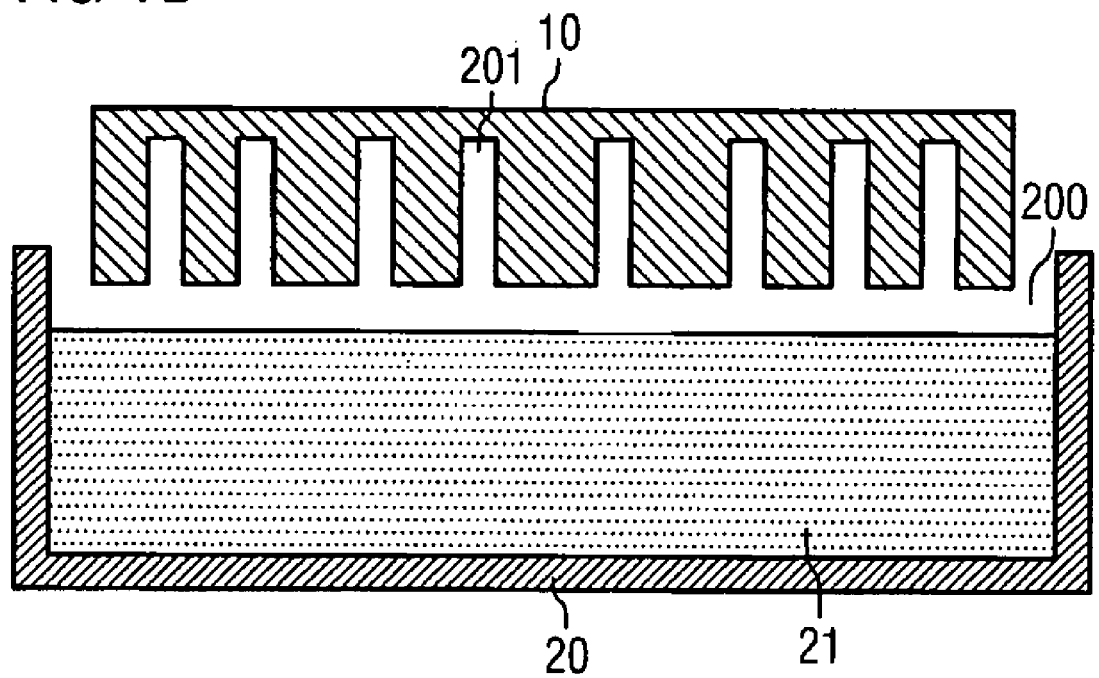

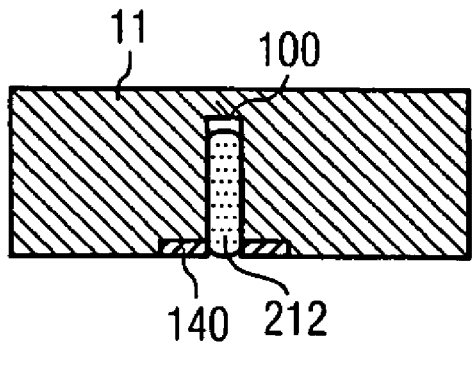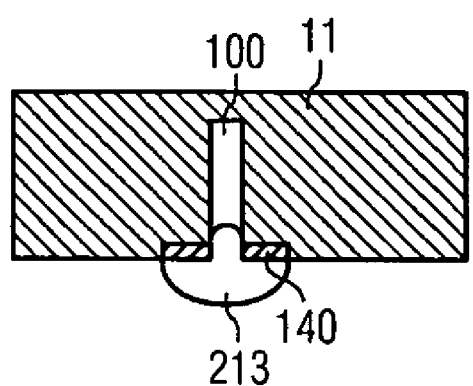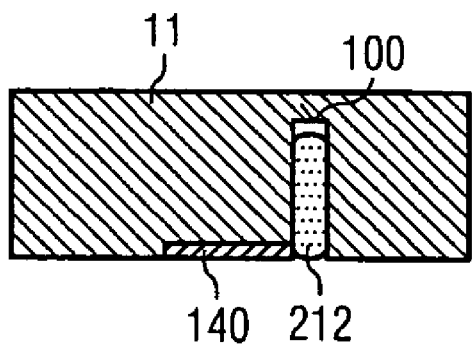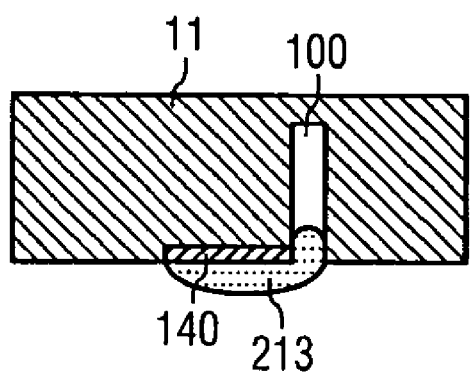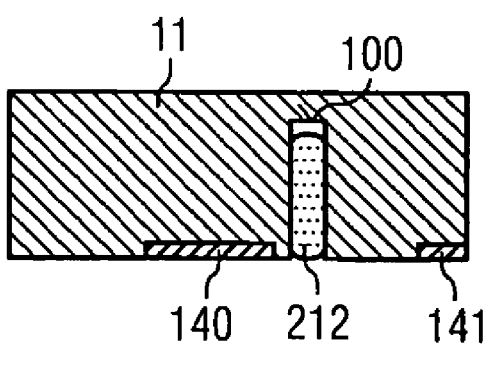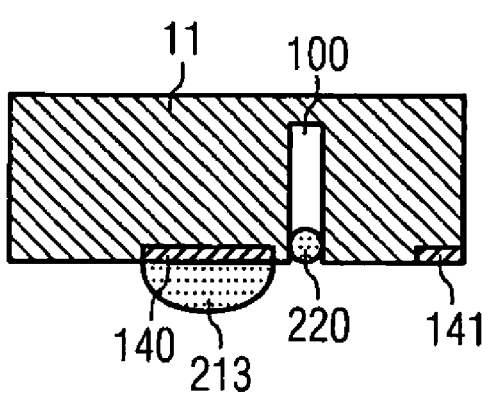

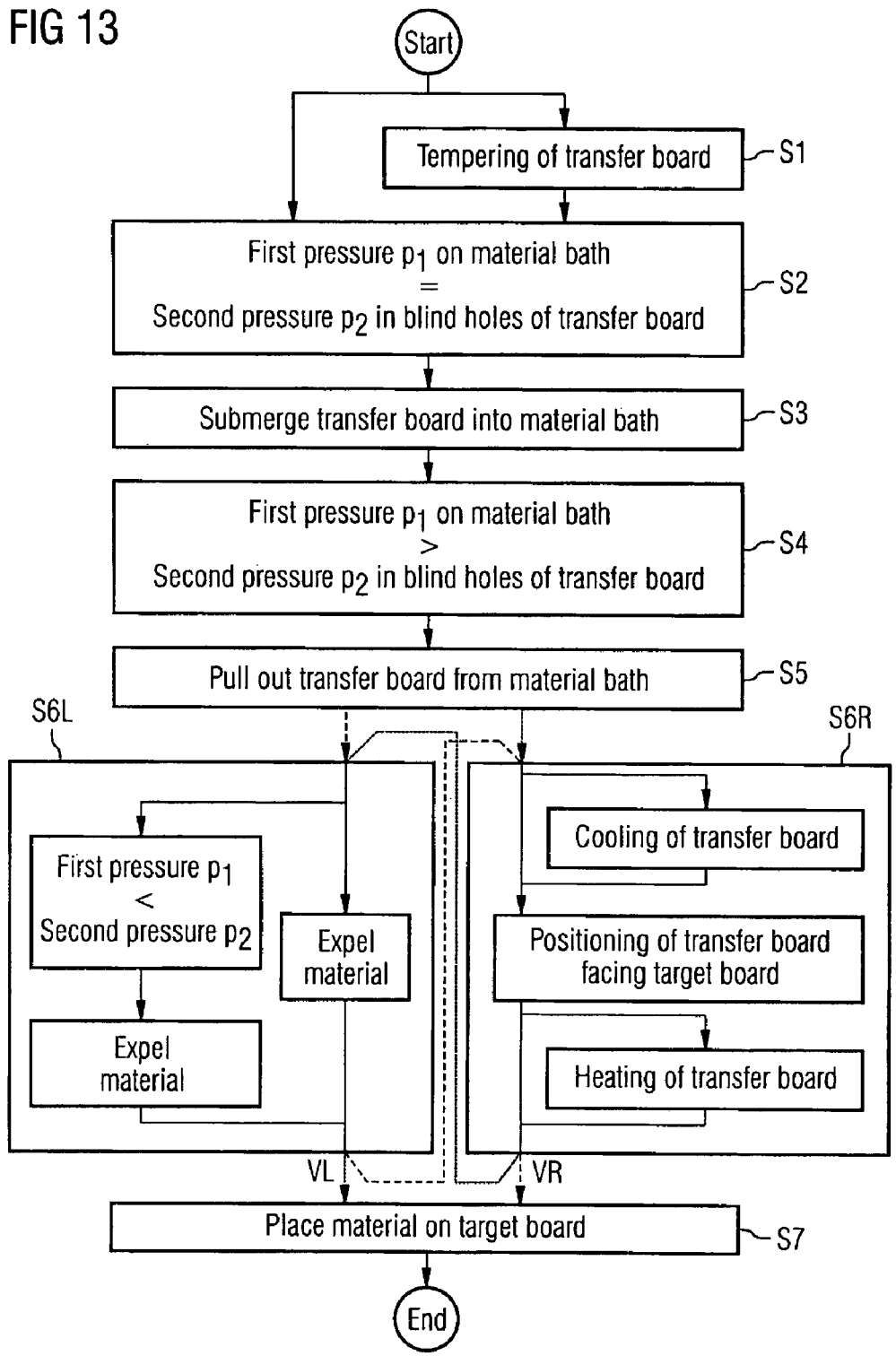

METHOD FOR PLACING MATERIAL ONTO A TARGET BOARD BY MEANS OF A TRANSFER BOARD

TECHNICAL FIELD OF THE INVENTION

The present invention relates to an apparatus and method for placing material onto a target board by means of a transfer board, and to a substrate and integrated circuit board having blind holes.

BACKGROUND OF THE INVENTION

Present day integrated circuitry frequently requires precise and well-defined placing of material onto a target board. Usual respective materials include, for example, electrically conducting materials, such as metallic solders, as well as optically or electronically functionalized materials, such as luminescent substances or organic semiconductor solutions. Furthermore, relevant target boards may include substrates, integrated circuits, microchips, or packages for contacting and/or housing integrated circuits.

In the case of methods for placing material, it is essential to steadily reduce the volume of a single material portion as well as to reduce the distance between adjacent material portions (pitch), both for the purpose of progressive integration and an increased performance of a ready device.

If the spatial dimensions of the material portions are reduced to micrometers, a reliable and reproducible dense placing of material becomes increasingly difficult. On the one hand, it has to be guaranteed that a material portion is reliably placed at a predefined location with a sufficient precision, on the other hand, contact between two adjacent material portions is to be avoided. Not only if solder materials are used, physical contact between two adjacent portions may lead to coalescing and thus to a short circuit or malfunction of a device.

Precise methods make use of a template in the form of a transfer board that comprises recesses at the predefined respective positions for placing the material. Material portions are firstly deposited, often more or less serially by means of a dispenser, into these recesses. Subsequently, a correct filling of the recesses with material may be verified by inspection, and the material portions can then be placed onto the target board simultaneously in one step by a adequate positioning of the transfer board opposite the target board.

It is a conventional method to fill such a transfer board by means of a portioning device, a form of a dispenser, wherein such a portioning device comprises a number of nozzles and is scanned over the transfer board. While the portioning device travels over the transfer board, the nozzles are activated in such a way that material portions are ejected from the nozzles at the correct moment and are deposited in the corresponding recesses of the transfer board. The precision and reliability of such a procedure strongly depends on the precise drive and alignment of the portioning device with regard to the transfer board, and on the correct activation of the nozzles. Furthermore, scanning of the portioning device requires time, which usually renders such procedures slow and error-prone.

SUMMARY OF THE INVENTION

The present invention provides particular advantages for an improved method for placing material onto a target board, an improved substrate with blind holes, an improved integrated circuit, as well as for an improved apparatus for placing material onto a target board.

In one embodiment of the present invention, there is a method for placing material onto a target board by means of a transfer board having a surface including a plurality of blind holes, including: (A) immersing the surface of the transfer board including the plurality of blind holes into a material bath which comprises the material in liquid form, wherein a first pressure acts on the material bath and a second pressure acts in the blind holes, and wherein the first pressure and the second pressure are substantially equal during immersion; (B) after immersion, generating a pressure difference between the first pressure acting on the material bath and the second pressure in the blind holes, the first pressure being higher than the first second pressure, so that the blind holes of the transfer board are filled partially with the liquid material such that an unfilled volume remains in a bottom part of each blind hole, wherein generating the pressure after immersion is done by operation of a pressure setting unit; (C) extracting the transfer board from the material bath; and (D) positioning the surface of the transfer board including the plurality of blind holes above and opposite to the target board, the material being expelled from the blind holes, such that the material touches the target board.

In another embodiment of the present invention, there is a substrate comprises a plurality of blind holes and contact pads in the surroundings of the blind hole openings at a surface of the substrate.

In still another embodiment of the present invention, there is an integrated circuit comprises at least one substrate with blind holes and contact pads, and comprises a further substrate with contact pads, wherein the contact pads of the substrate are electrically connected to the facing contact pads of the further substrate by means of a solder material expelled from the blind holes.

In another embodiment of the present invention, there is an apparatus for placing material onto a target board by means of a transfer board with a plurality of blind holes, comprises a recipient, a control unit, and a pressure setting unit, wherein a material bath with liquid material and a positioning unit are provided in the recipient, and wherein the control unit controls the pressure setting unit in a first step in such a way that a first recipient pressure is established within the recipient, controls the positioning unit in a second step in such a way that it immerses the transfer board with the plurality of blind holes into the material bath, controls the pressure setting unit in a third step, taking place after immersion of the transfer board, in such a way that a second recipient pressure is established within the recipient, the second pressure being greater than the first pressure, and controls the positioning unit in a fourth step in such a way that it extracts the transfer board from the material bath.

BRIEF DESCRIPTION OF THE DRAWINGS

These above recited features of the present invention will become clear from the following description, taken in conjunction with the accompanying drawings. It is to be noted, however, that the accompanying drawings illustrate only typical embodiments of the present invention and are, therefore, not to be considered limiting of the scope of the invention. The present invention may admit other equally effective embodiments.

FIGS. 1A through 1F show the placing of material by means of a transfer board according to a first embodiment of the present invention.

FIGS. 9A and 9B show a blind hole and a contact pad according to a ninth embodiment of the present invention.

FIGS. 10A and 10B show a blind hole and a contact pad according to a tenth embodiment of the present invention;

FIGS. 11A and 11B show a blind hole and a contact pad according to an eleventh embodiment of the present invention.

FIG. 13 shows the sequence of a method according to a thirteenth embodiment of the present invention.

DETAILED DESCRIPTION OF THE INVENTION

Figure 1C:
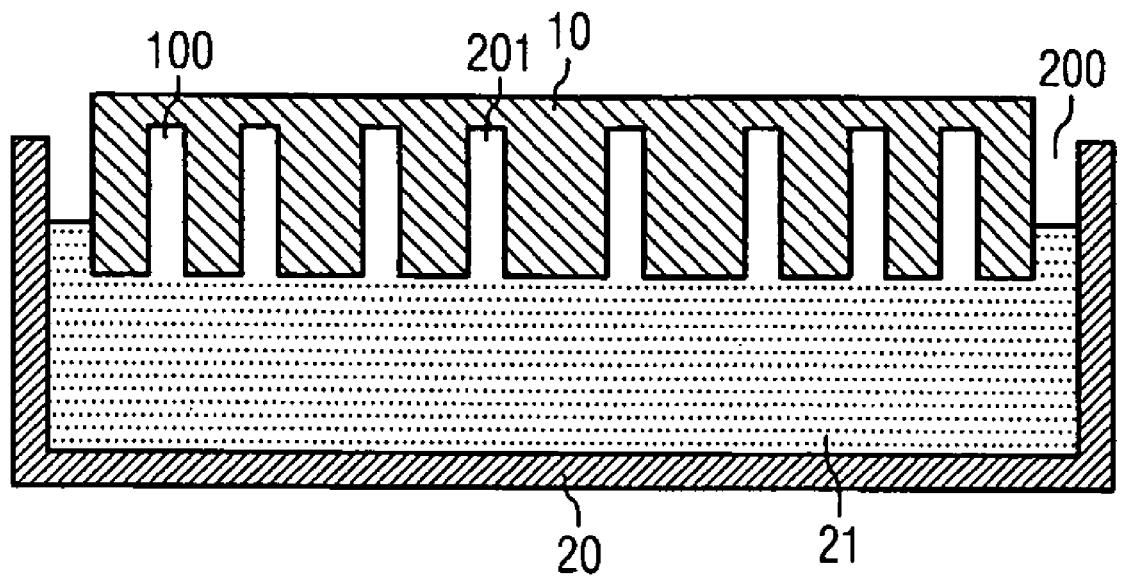

FIG. 1A shows a transfer board 10 comprising blind holes 100 according to a first embodiment of the present invention. The plurality of blind holes 100 may thereby extend along an entire surface of the transfer board 10. In general, the position of each blind hole 100 is chosen in such a way that it corresponds to the position of the material to be placed on a target board. To meet present-day demands, the diameter of a blind hole 100 is usually less than 10 µm, and the minimum distance between two adjacent blind holes is less than 50 µm. Moreover, the aspect ratio of the blind hole depth to the blind hole diameter may be more than 3. By means of an increased aspect ratio, a blind hole 100 may be able to hold more material for the purpose of producing and placing larger portions of a target material.

As shown in FIG. 1B, the transfer board 10 is ready for immersion in a material bath 20 holding a material 21 which is in a liquid state. The material 21 may comprise a metallic or conductive material, a solder material or other optically or electronically functionalized materials, such as nanoparticles in an appropriate carrier solution. Before and during immersion, a first pressure 200 acts on the material bath 21 and a second pressure 201 acts in the blind holes 100. During this process stage, the first pressure 200 essentially equals the second pressure 201.

In a further process step, as shown in FIG. 1C, the transfer board 10 is immersed into the liquid material 21 in the material bath 20. Since the first pressure 200 essentially equals the second pressure 201, only an insignificant amount of material is pressed into the blind holes 100.

Figure 1D:
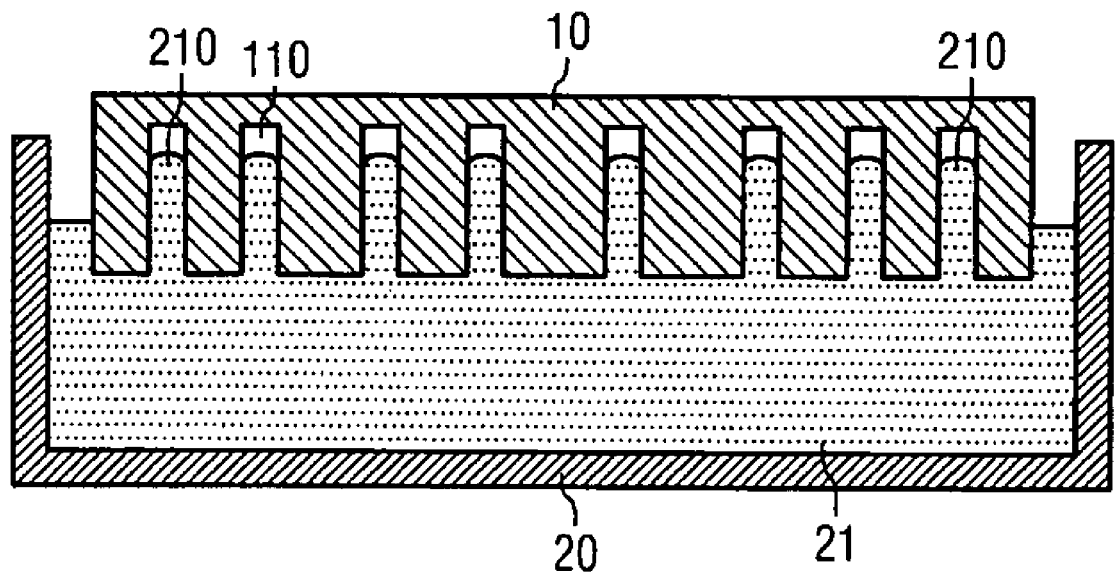

By generating a first pressure difference between the first pressure 200 acting on the material 21 and the second pressure 201 in the blind holes 100, as shown in FIG. 1D, the blind holes 100 are filled, at least partially, with liquid material 21. The individual blind holes 100 may further comprise a remaining volume 110 devoid of the material 21 and a portion 210 of the material 21. The size and volume of the portion 210 and of the remaining volume 110 is essentially determined by the pressure difference between the first pressure 200 and the second pressure 201. Furthermore, capillary forces, surface forces and/or wetting forces act on the material portion 210. Usually, the material 21 is not substantially wetting the walls of the blind holes 100 in the transfer board 10.

Figure 1E:
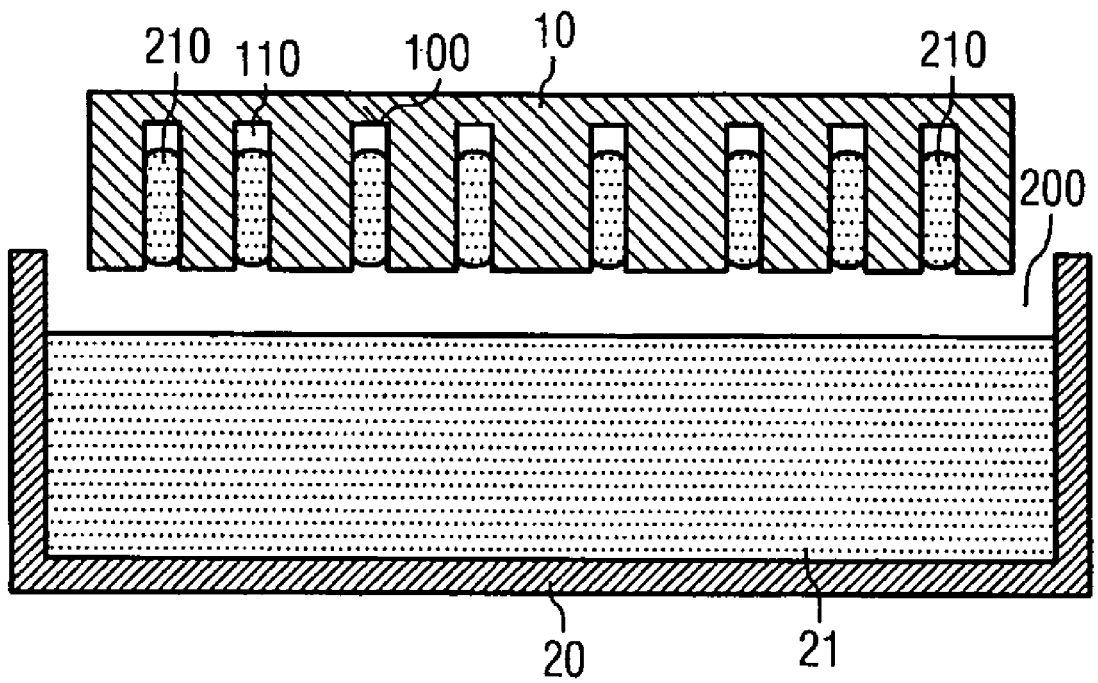

In a further process step, as shown in FIG. 1E, the transfer board 10 is extracted from the material bath 20. Thereby, portions 210 of the material 21 remain in the blind holes 100 of the transfer board 10. A superposition of forces, caused by the pressure difference between the first pressure 200 and the second pressure 201 in the remaining volume 110 of a blind hole 100, capillary forces, surface tension of the portion 210, and wetting forces acts on the portion of the material 21. Therefore, the portion 210 of the material 21 may already be expelled, at least partially, from the blind hole 100 without changing the first or second pressure 200, 201. For example, the surface tension may already suffice to expel a portion of the material 21.

Moreover, the material 210 in the blind holes 100 may be solidified in this stage of the process. This can, for example, be effected by cooling, so that the portions 210 of the material 21 in the blind holes solidify. The filled transfer board 10 with the portions 210 is thus in a stable state and the portions 210 are safely and reliably introduced into the blind holes 100. The transfer board 10 may in stage be handled safely, stored over long periods of time, unmounted from a filling apparatus and/or mounted in other manufacturing equipment for further processing.

If e.g. a solder is used as the material 21, the temperatures for the liquid material are above the corresponding melting point, e.g. above 200° C. in the case of a conventional lead-free solder. Cooling of the transfer board 10 below this temperature allows for solidification of the solder within the blind holes 100. The melting temperature may be considerably lower or higher for other materials 21. In the case of placing organic dissolvable materials, or other particles in a liquid solution, solidification may take place at considerably lower temperatures, e.g. at temperatures at or below 0° C. Organic substances may freeze at temperatures below 50° C.

Figure 1F:
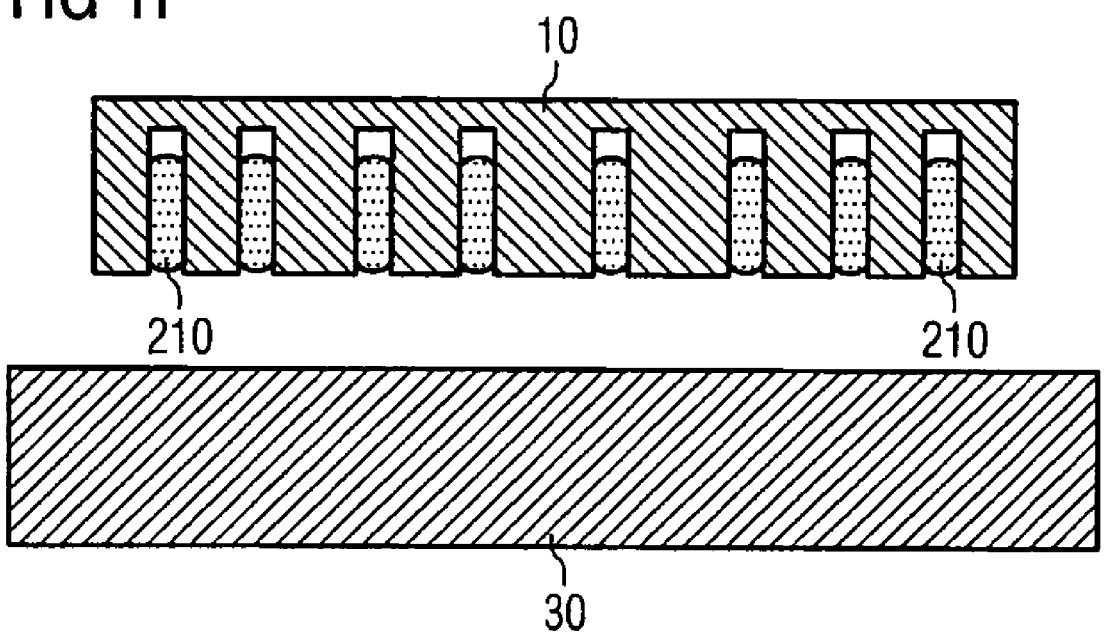

As shown in FIG. 1F, the transfer board 10 is positioned opposite to a target board 30. Hereby, the portions 210 of the material 21 are either at first expelled from the blind holes 100 and then the transfer board 10 is positioned opposite to the target board 30 in such a way that the portions 210 of the material 21 touch the target board 30 and the material 21 is placed onto the target board 30, or at first the transfer board 10 is positioned in the vicinity of the target board 30, so that the expelling of the portions 210 of the material 21 from the blind holes 100 brings the material into direct contact with the target board 30. As in the above described cases, the inventive method allows for the parallel filling of all blind holes 100 of the transfer board 10 in one step, the parallel formation of pearl-shaped portions, and/or the parallel placement of material on a target board 30.

Figure 2A:
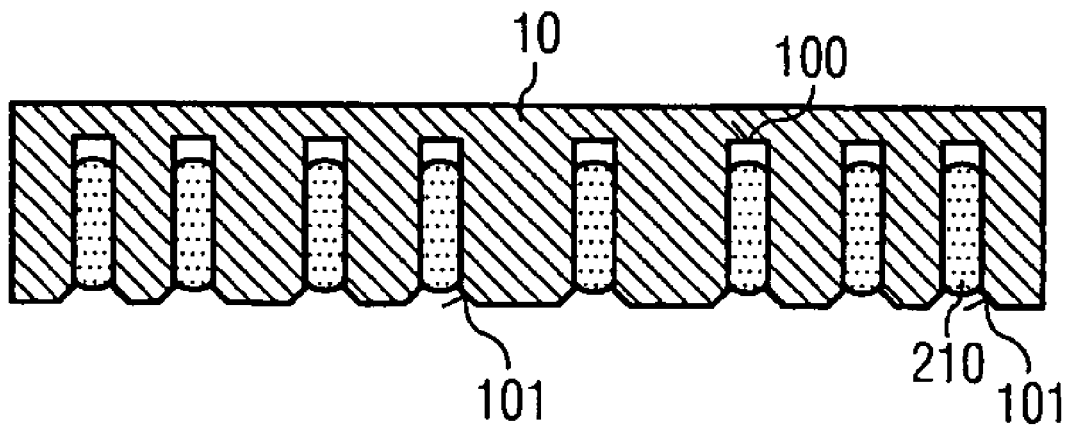
FIGS. 2A and 2B show the expelling of material from a transfer board according to a second embodiment of the present invention.
Figure 2B:
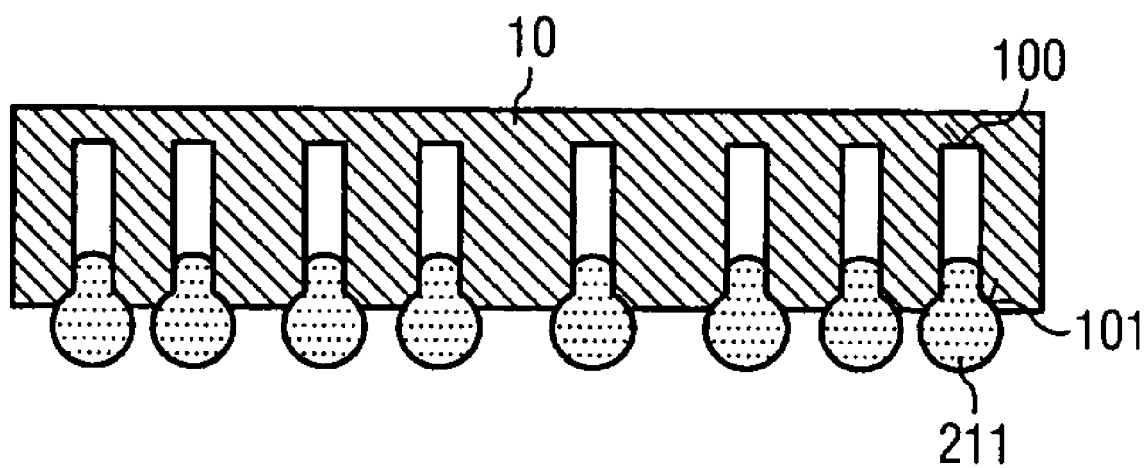

FIGS. 2A and 2B show the expelling of the material from a transfer board 10 according to a second embodiment of the present invention. FIG. 2A shows the transfer board 10 with bevels 101 at a surface of the transfer board 10 in the surrounding of the blind hole openings. If the portion 210 of the material 21 is expelled at least partially form the blind holes 100, pearl-shaped portions 211 of the material 21 may form in the surrounding of the blind hole 100 openings, as shown in FIG. 2B. The essentially curved surface of the pearl-shaped portions 211 allow a punctiform initial mechanical contact when positioned close to a target entity. Starting from this punctiform contact area, contact of the material portion with the target entity, such as a target contact pad, may expand concentrically. In this way, the formation of gas traps and voids is strongly suppressed, and a reliable and uniform joint of the material and the target entity may be obtained. The material 21 may be in a liquid state during this stage or may also be pressed by a sufficient pressure onto the target entity in a solid state.

The bevels 101 in the surrounding of the blind hole openings may support the formation of the pearl-shaped portions 211 and/or the adhesion of the pearl-shaped portions 211 at the transfer board 10. With respect to an expelling by means of the surface tension of the portion 210 or the pearl-shaped portion 211 of the material 21, the bevels 101 may have a favorable effect.

Figure 3A:
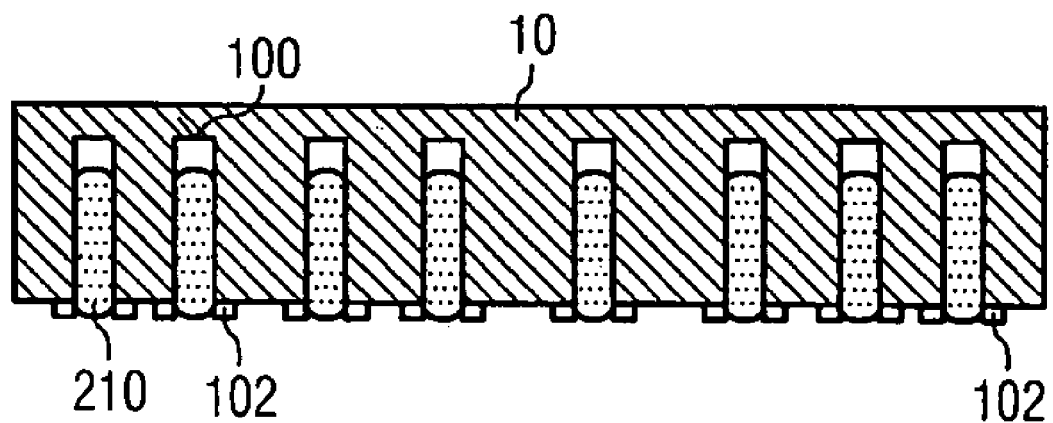
FIGS. 3A and 3B show the expelling of the material from a transfer board according to a third embodiment of the present invention.
Figure 3B:
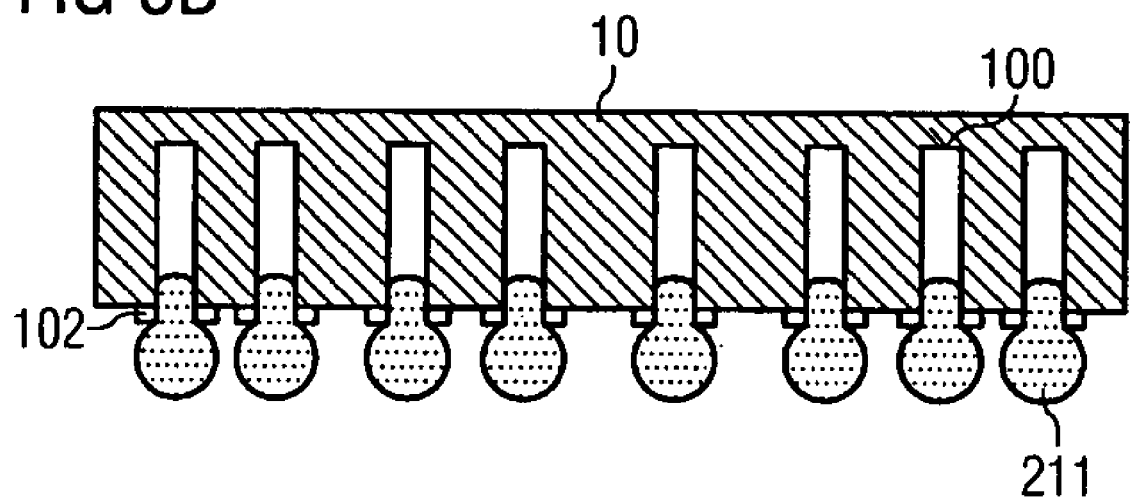

FIGS. 3A and 3B show the expelling of the material from a transfer board 10 according to a third embodiment of the present invention. FIG. 3A shows a transfer board with wetting eyes 102 on a surface of the transfer board 10 at the surroundings of the blind hole openings. If the portion 210 of the material 21 is expelled at least partially form the blind holes 10, a pearl-shaped portion 211 of the material 21 may form in the surroundings of the blind hole openings. The wetting eyes 102 may support the formation of the pearl-shaped portions 211 at the transfer board 10. The wetting properties of the wetting eyes 102 may further support an expelling by means of the surface tension and wetting forces of the portion 210 or of pearl-shaped portions 211 of the material 21, as the liquid material 21 may tend to form a droplet. The wetting eyes 102 also may keep the material portions 211 at a well-defined position and therefore inhibit a coalescence of neighboring portions 211. Furthermore, a combination of bevels 101 and wetting eyes 102 may be employed.

Figure 4A:
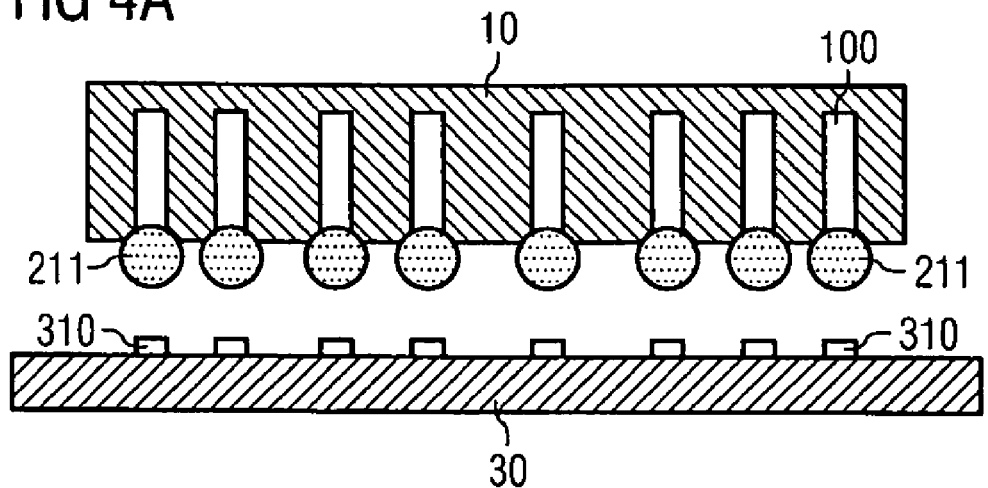
FIGS. 4A through 4C show the placing of material onto a target board according to a fourth embodiment of the present invention.
Figure 4B:
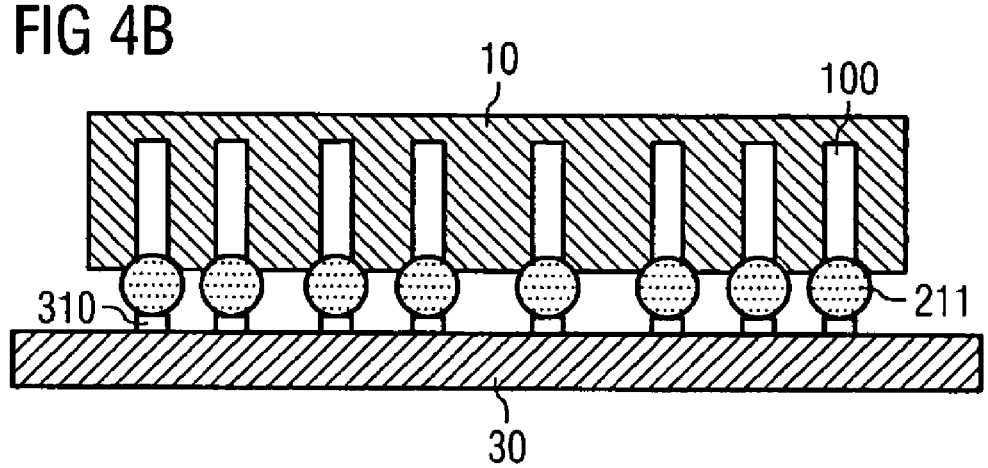
Figure 4C:
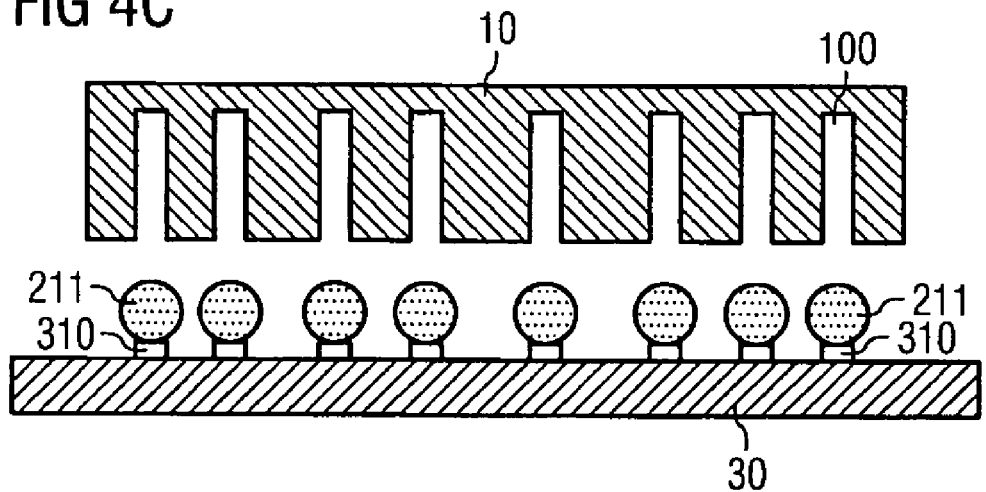

FIGS. 4A through 4C show the placing of material on a target board according to a fourth embodiment of the present invention. FIG. 4A shows a transfer board 10 comprising blind holes 100 with pearl-shaped portions 211 of the material 21 in the surroundings of the blind hole openings. Furthermore, the target board 30 is shown with wetting pads 310. For each pearl-shaped portion 211 of the material 21 to be placed, one wetting pad 310 at a corresponding position may be provided on the target board 30.

As shown in FIG. 4B, the transfer board 10 with the pearl-shaped portions 211 is brought into a vicinity of the target board 30 so that the pearl-shaped portions 211 of the material 21 touch the wetting pads 310 of the target board 30. The material 21 may wet the wetting pads 310, so that the material 211 adheres to the wetting pads 310 and tends to cover most of the wetting pad 310.

As shown in FIG. 4C, the pearl-shaped portions 211 of the material 21 adhere to the wetting pads 310 of the target board even if the transfer board 10 is removed. The wetting pads 310 may, e.g., be contact pads for contacting functional elements of an integrated circuit being part of the target board 30.

Figure 5A:
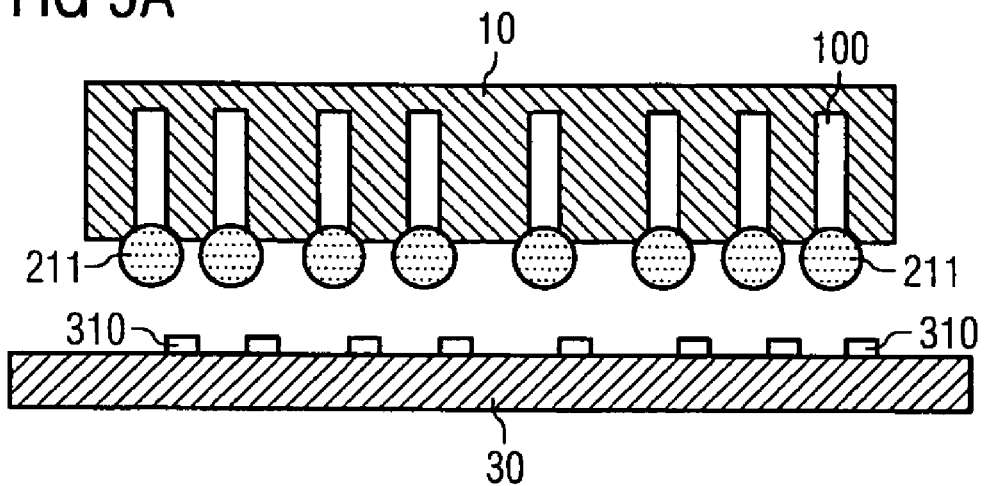
FIGS. 5A through 5C show the placing of material onto a target board according to a fifth embodiment of the present invention.
Figure 5B:
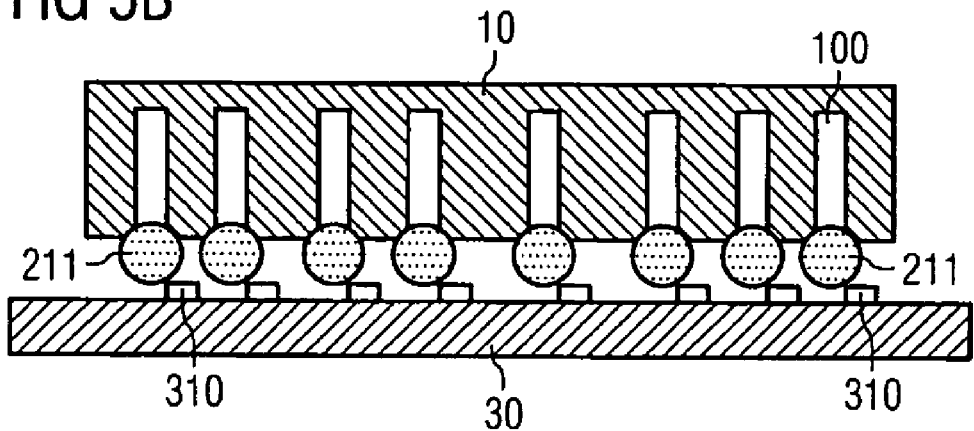
Figure 5C:
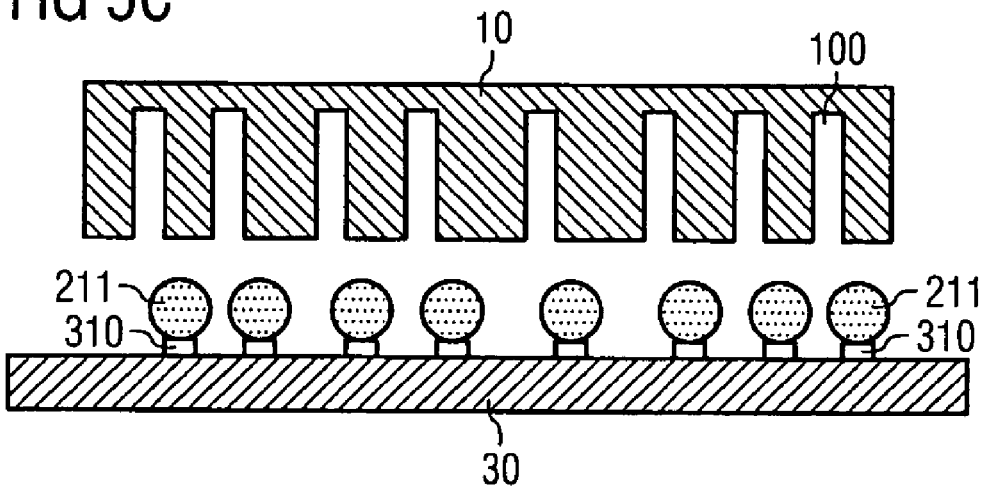

FIGS. 5A through 5C show a placing of material onto a target board 30 by means of the transfer board 10 in a variation of the embodiment shown in FIGS. 4A to 4C and according to a fifth embodiment of the present invention. Thereby, the positioning of the transfer board 10 relative to the target board 30 is carried out with some misalignment, as can be seen from FIG. 5B. Usually, such misalignment is unintentionally and results from process and equipment tolerances. The provision of the wetting pads 310, however, allows for safe and reliable placing of the pearl-shaped portions 211 of the material 21 on the target board 30 in this case as well, as, in general, the material may wet the wetting pads 310 much better than the surface of the target board 30, thus being attracted thereby and adhering thereto. For reliable compensation of a misalignment, the maximum misalignment which may be compensated for by the described method is approximately half the width of the pearl-shaped portions 211 of the material 21. Thereby, the minimum distance between two pearl-shaped portions 211 of the material 21 to be placed may correspond to the diameter of a pearl-shaped portion 211.

Figure 6A:
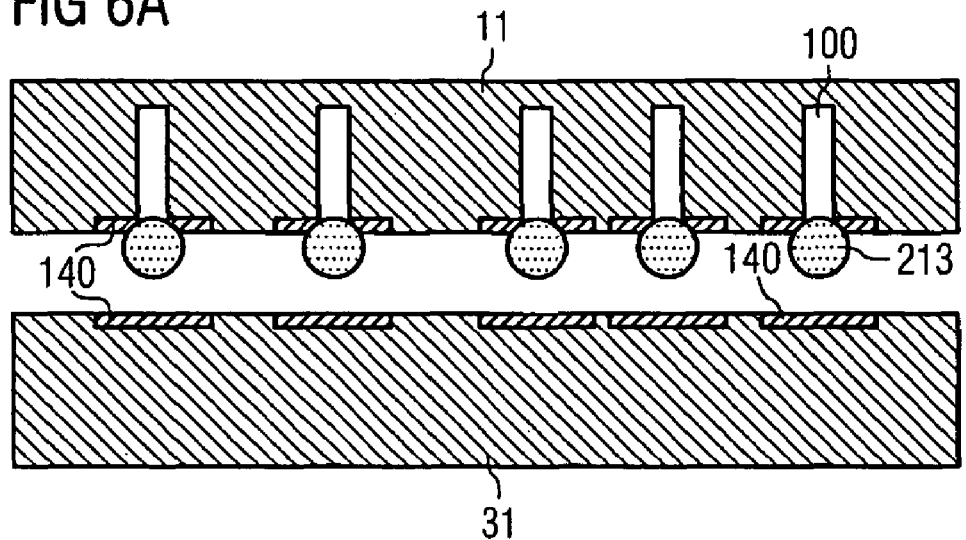
FIGS. 6A through 6C show the contacting of two substrates by means of a solder according to a sixth embodiment of the present invention.
Figure 6B:
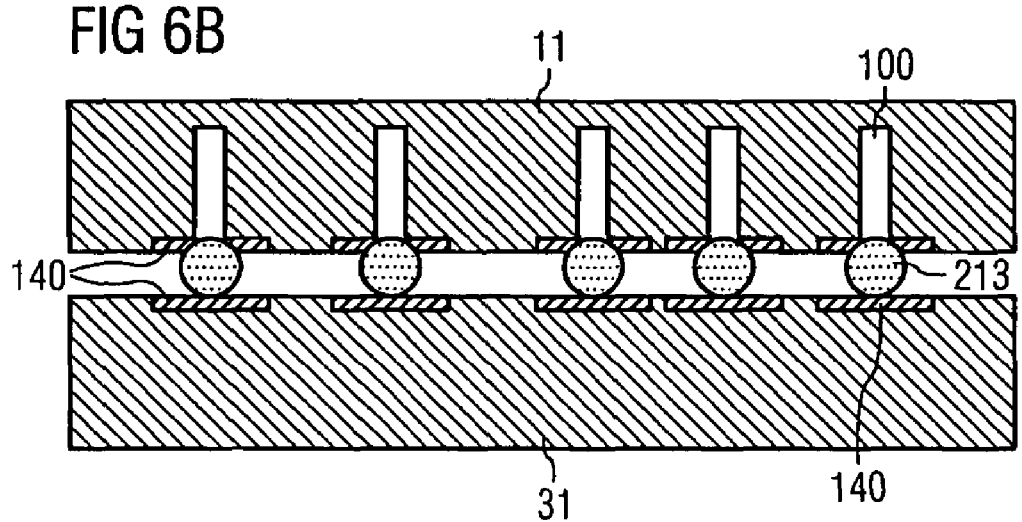
Figure 6C:
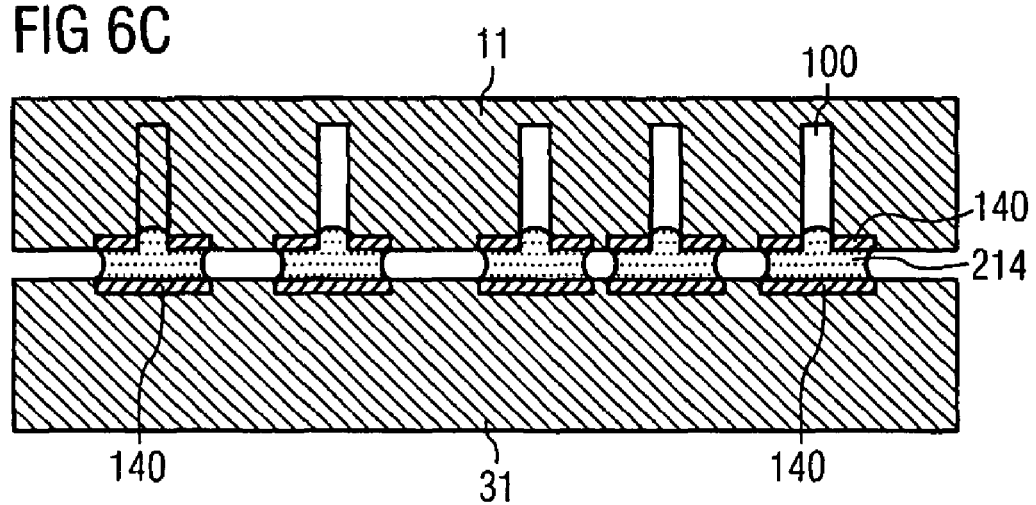

FIGS. 6A through 6C show a placing of pearl-shaped portions 213 of a material, such as a solder, by means of a transfer substrate 11 comprising a plurality of blind holes 100 and contact pads 140 in a surrounding of the blind hole openings. According to this sixth embodiment of the present invention, pearl-shaped portions 213 of material have already been expelled and are arranged in a surrounding of the contact pad 140 of the transfer substrate 11, as shown in FIG. 6A. The transfer substrate 11 may comprise a semiconductor or silicon substrate, which may already comprise functionalized electronic or optical entities, such as an integrated circuit. Functionalized entities include doped regions of a semiconductor, transistors, conductive lines, resistors, capacitors, or diodes as well.

In a further step, as shown in FIG. 6B, the transfer substrate 11 is brought into the vicinity of a target substrate 31, which may also comprise corresponding contact pads 140. In a first instance, physical contact of the pearl-shaped portions 213 of the material to the contact pads 140 of the target substrate 31 may be punctiform, given by the essentially curved surface of the pearl-shaped portions 213. The curvature of the pearl-shaped portions 213 advantageously allows for this first contact on a very small contact area. This may apply to solid as well as to liquid materials, such as solder materials and other relevant materials.

If the material of the pearl-shaped portions 213 is solid, it is now liquefied, e.g. by heating. As shown in FIG. 6C, the pearl-shaped portions 213 melt, wetting the contact pads 140 and thus forming a soldered joint 214. Melting takes place and the material gradually wets and covers more and more of the contact pad 140, this process starting from the abovementioned punctiform initial contact area, which is formed by the pearl-shaped portion 213 with a contact pad 140 of the target substrate 31. In this way, an undesired inclusion of trapped gases, voids, or bubbles is suppressed. The soldered joints 214 may thus reliably connect the opposite contact pads 140 of the transfer substrate 11 and the target substrate 31 electrically as well as mechanically.

The liquefaction of the solder material is typically carried out by heating. Furthermore, the inventive method may be used for contacting several transfer substrates 11 by providing contact pads 140 on the other side of the transfer substrate 11 as well, and by placing a further transfer substrate with corresponding contact pads 140 and blind holes 100 onto the first transfer substrate 11. Thus it is—in principle—possible to electrically contact and mechanically affix an unlimited number of substrates by at first stacking these correspondingly, and then letting the pearl-shaped portions 213 of the solder material at the same time generate the electrical and the mechanical connection between the contact pads 140 of the substrates. This may be effected by a single heating stage of the stacked substrates, hence minimizing the thermal budget being imposed onto the substrates and the integrated circuits being structured therein. In this way, a superordinate integrated circuit may be realized comprising the integrated circuits of the substrates, these integrated circuits being interconnected by means of the contact pads 140 and solder joints 214.

Figure 7A:
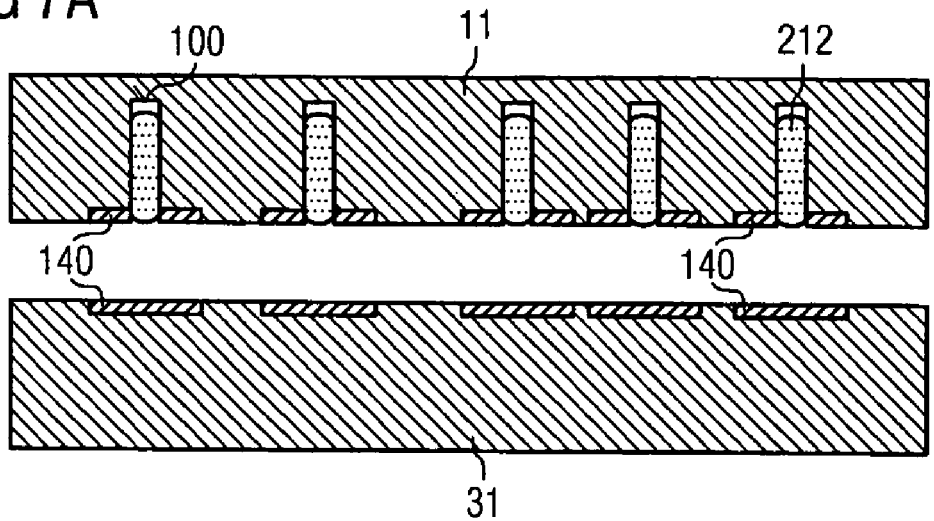
FIGS. 7A through 7C show the contacting of two substrates by means of a solder according to a seventh embodiment of the present invention.
Figure 7B:
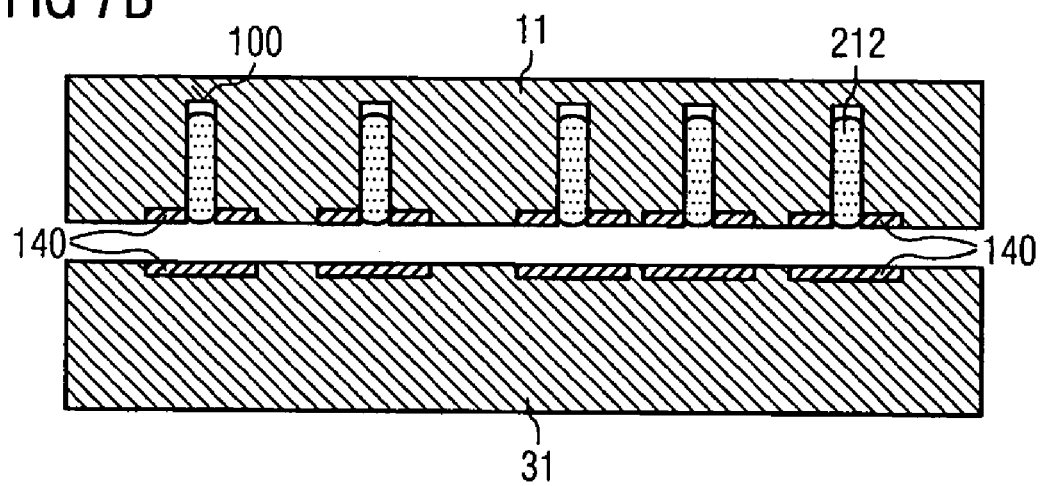
Figure 7C:
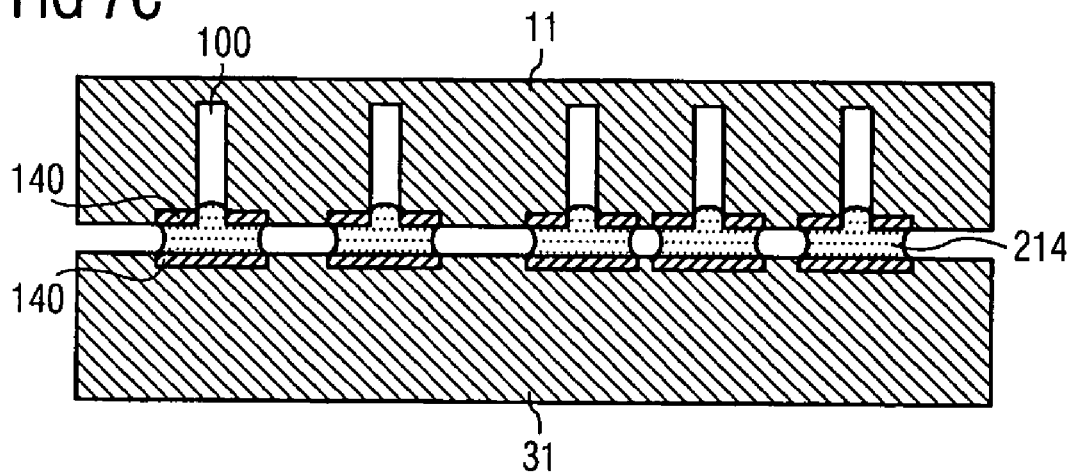

As shown in FIGS. 7A through 7C, according to a seventh embodiment of the present invention, the expelling of a solder material 212 in the blind holes 100 of a transfer substrate 11 may not be carried out until the transfer substrate 11 has been positioned in the vicinity of the target substrate 31. As shown in FIGS. 7A and 7B, the portions 212 of a solder material remain in the blind holes 100 of the transfer substrate 11. The transfer substrate 11 comprises contact pads 140 in an area of the blind hole openings, and the target substrate comprises corresponding contact pads 140. If the transfer substrate 11 is positioned sufficiently near to the target substrate 31, the portions 212 of the solder material are expelled from the blind holes 100 in such a way that the solder material forms a soldered joint 214 between two opposite contact pads 140 of the transfer substrate 11 and the target substrate 31.

Figure 8A:
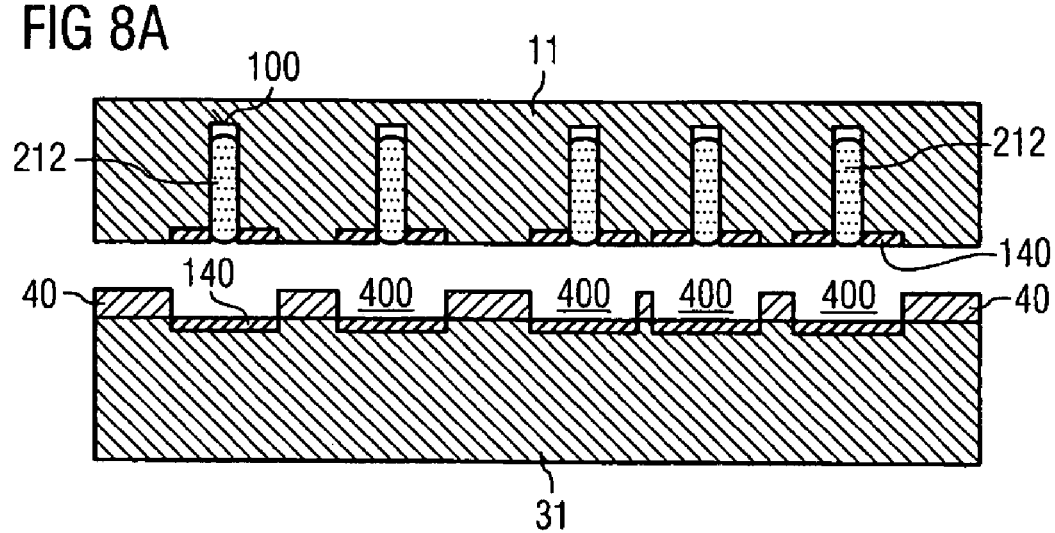
FIGS. 8A through 8C show the contacting of two substrates by means of a solder according to an eighth embodiment of the present invention.
Figure 8B:
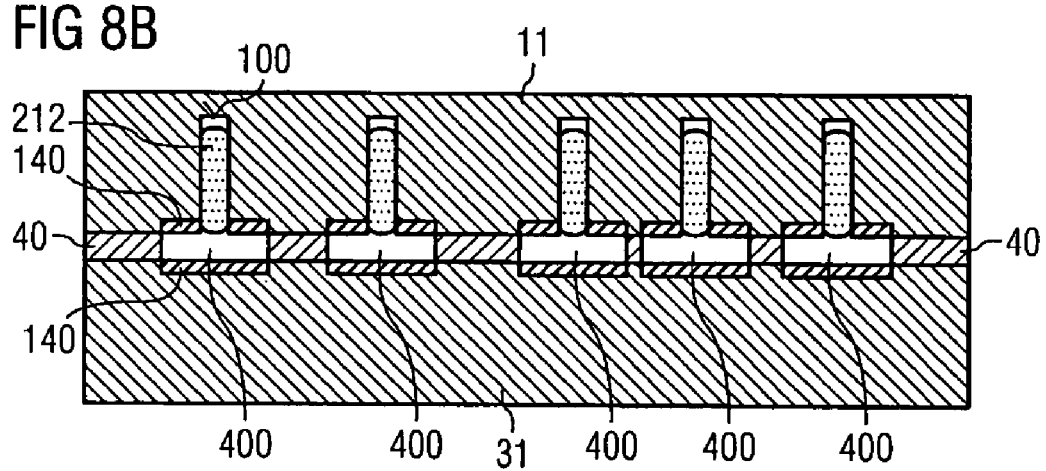
Figure 8C:
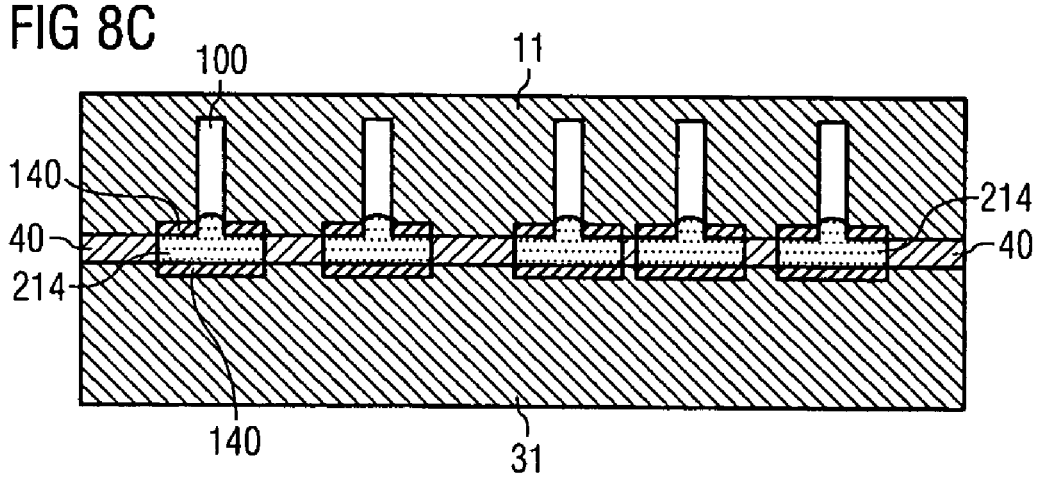

According to an eighth embodiment of the present invention, as shown in FIGS. 8A through 8C, a intermediate layer 40 may be provided on the target substrate 31 or on the transfer substrate 11 in variation of the above-explained methods. In the area of the contact pad 140, the intermediate layer 40 comprises openings 400.

As shown in FIG. 8B, the transfer substrate 11 may be mechanically affixed to the target substrate 31 by means of the intermediate layer 40. If, prior to expelling the material from the blind holes 100, a stacking of several substrates is carried out, the intermediate layer 40 may bind two substrates to each other. During further addition of one or more further substrates slipping of substrates of the already built stack is suppressed and the relative positions of the corresponding contact pads 140 are maintained reliably. The expelling of the material portions 212 from all blind holes 100 may then be carried out in one step so that opposite contact pads 140 are electrically connected by means of a soldered joint 214.

FIGS. 9A and 9B show an arrangement of a blind hole 100 and a contact pad 140 in and on a transfer substrate 11, according to a ninth embodiment of the present invention. Thereby, the blind hole 100 is arranged such that the opening of the blind hole 100 is inside a contact pad 140. The blind hole 100 is furthermore, at least partially, filled with a portion 212 of a material, e.g. a solder material. If the portion 212 is expelled from the blind hole 100, a pearl-shaped portion 213 of the material forms on the contact pad 140, as shown in FIG. 9B. If the material wets the contact pad 140, wetting forces may support the formation of pearl-shaped portion 213. The arrangement in accordance with this embodiment of the present invention ensures that the material, when expelled, reliably touches the contact pad 140 and is positioned thereon as a pearl-shaped portion 213 or as a soldered joint.

According to a tenth embodiment of the present invention, as shown in FIGS. 10A and 10B, a blind hole 100 is arranged in a transfer substrate 11 adjacent to a contact pad 140. In the case that the material wets the contact pad 140, a pearl-shaped portion 213 forms on the contact pad 140 in this case as well. For this it may suffice that the material wets the surface of the substrate 11 less than the contact pad 140. In accordance with this embodiment of the present invention, the structuring of the contact pad 140 and the blind holes 100 may be carried out independently from each other, and the region in the transfer substrate 11 below the contact pad 140 may be used for supply lines or other functionalized entities, and is therefore not limited by the presence of a blind hole 100.

According to an eleventh embodiment of the present invention, as shown in FIGS. 11A and 11B, the blind hole 100 may be arranged in the transfer substrate 11 in a vicinity of a contact pad 140. According to this embodiment, the blind hole 100 is arranged closer to a target contact pad 140 than to an adjacent contact pad 141, so that the portion 213 of the material, such as a solder, when expelled from the blind hole 100, covers the target contact pad 140 and not the adjacent contact pad 141. For this it may suffice that the material wets the surface of the substrate 11 less than the contact pad 140. Thus the material forms a pearl-shaped portion 213 only on the contact pad 140, as shown in FIG. 11B. Nevertheless, a pearl-shaped portion 213 may also be formed on the adjacent contact pad 141 by means of material expelled from a respective blind hole arranged in a vicinity of the adjacent contact pad 141. In this process, a remainder 220 of the material may remain in the blind hole 100. According to this embodiment, not only the region in the transfer substrate 11 directly below the contact pad 140 may be functionalized, but this arrangement may also be more insensitive to tolerances in the positioning of the blind holes 100 relative to the contact pads 140 as far as process misalignment is concerned. This misalignment may, for example, be caused during lithographic patterning of the contact pads 140 and/or of the blind holes 100.

Figure 12:
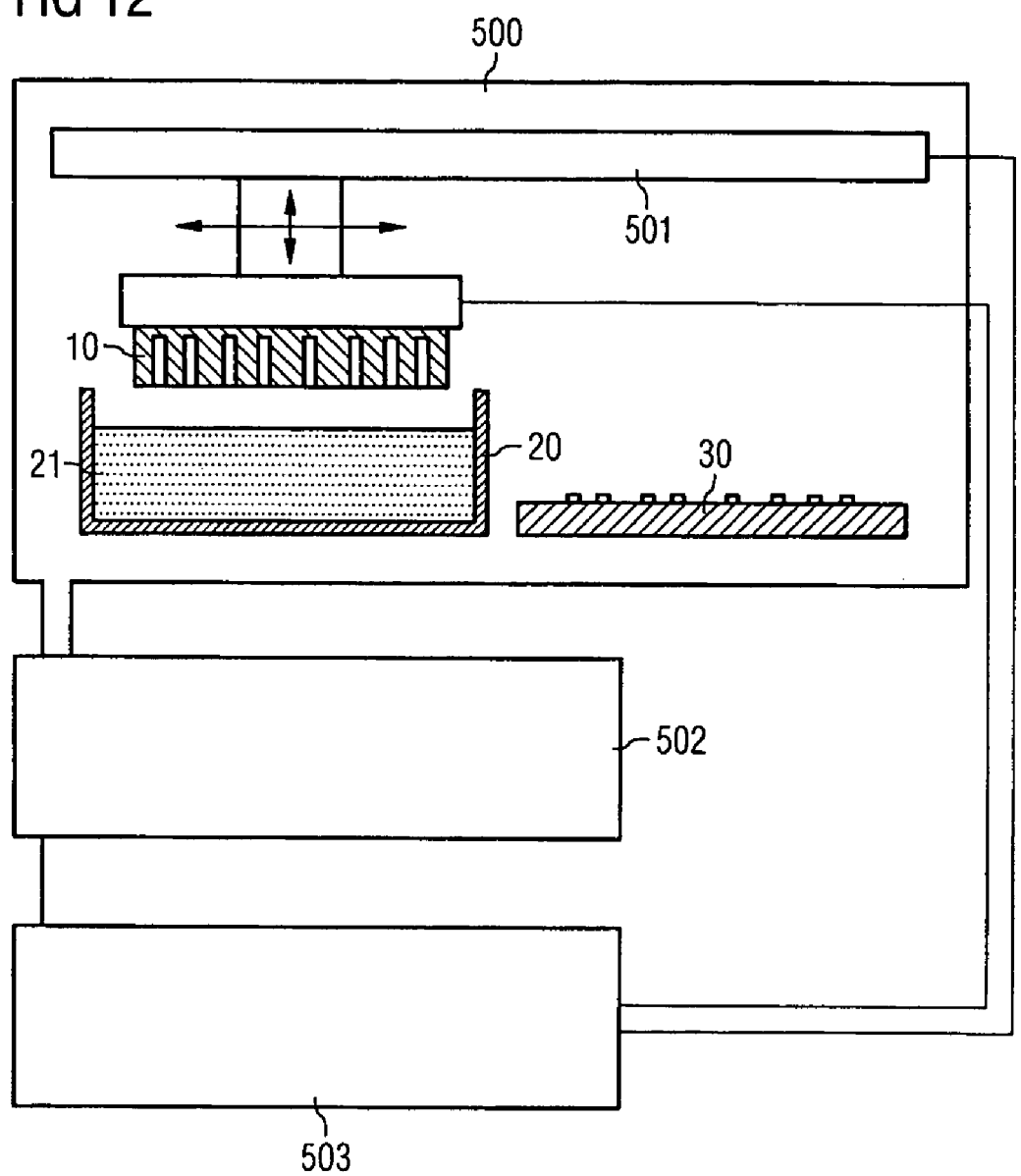
FIG. 12 shows an apparatus for placing material according to a twelfth embodiment of the present invention.

FIG. 12 shows an apparatus according to a twelfth embodiment of the present invention for placing material. The apparatus comprises a recipient 500 and a pressure setting unit 502. The pressure setting unit 502 controls the recipient pressure within the recipient 500 and may set the recipient pressure in a well-defined and reproducible manner. The pressure setting unit 502 may comprise a vacuum pump and/or a compressor, such as a rotary pump, or, if the vacuum and/or the pressurized air or gas are provided externally, merely comprise corresponding valves and means for sensing a pressure inside the recipient 500. Pressures below 5 mbar are considered a sufficient vacuum and atmospheric pressure may correspond to essentially 1 bar. In general, the pressure setting unit 502 may set a pressure in the recipient 500 in said range or may vary the pressure by 1 bar.

In the recipient 500 a positioning unit 501 for positioning a transfer board 10 is arranged. The positioning unit 501 may immerse the transfer board 10 into a material bath 20 comprising liquid material 21. The positioning unit 501 may furthermore position the transfer board 10 opposite to a target board 30. For the latter positioning opposite the target board 30, the apparatus may also comprise a further positioning unit inside or outside the recipient 500. A further control unit may then be provided for controlling the further positioning unit. In the case, the apparatus comprises a further positioning unit, the positioning unit in the recipient 500 may be simplified, as its function may be limited to a simple immersion and pulling out of the transfer board 10 into and from the material bath 20. Since the positioning of the transfer board 10 opposite the target board 30 may require higher alignment precision, often below 1 µm, the further positioning unit may be optimized for this.

A control unit 503 controls the pressure setting unit 502, as well as the positioning unit 501. The positioning unit 501 and the bath 20 may further comprise tempering units in order to control the temperature of the transfer board 10 and/or the material 21 in a regulated manner, e.g. in the range of 10° C. to 300° C. This may be done for the purpose of melting the material, for solidifying the material 21 in the blind holes of the transfer board 10, for expelling the material 21 from the blind holes 100, or to adjust the temperature of the transfer board 10 in order to minimize thermal stress and damages prior to the immersion into a hot material. Furthermore, renewed heating may liquefy the material in the blind holes of the transfer board 10 and the board 10 may be positioned opposite to the target board 30 in such a way that portions of material 21 in the blind holes of the transfer board 10 are placed onto the target board 30. Thereby, the material 21 in the blind holes of the transfer board 10 may be expelled by capillary forces or by the surface tension of the material, respectively. This process may be supported, inhibited, or controlled in a well-defined manner by setting the corresponding pressure by means of the pressure setting unit 502.

FIG. 13 shows the sequence of a method, according to a thirteenth embodiment of the present invention in conjunction with variants. Initially, the temperature of a transfer board may be adjusted in an optional step S1, in order to subject the board to as little thermal tension and stress as possible during a subsequent immersion into a material bath. In a step S2, a pressure compensation between a first pressure $p_1$ acting on the material bath and a second pressure $p_2$ in blind holes of the transfer board is ensured. Thereafter, the transfer board is immersed into the material bath in a step S3. If the blind hole openings in the transfer board are within the material bath, a pressure difference between the first pressure $p_1$ acting on the material bath and the second pressure $p_2$ in the blind holes of the transfer board is generated in a step S4, the first pressure $p_1$ being larger than the second pressure $p_2$ so that the blind holes of the transfer board are at least partially filled with the material. The pressure difference may be generated by lowering the second pressure $p_2$ in the blind holes of the transfer board, as well as by increasing the first pressure $p_1$ onto the material bath. Usually, a pressure difference of essentially 1 bar may suffice. For example, starting from a balanced pressures during step S2 at essentially a vacuum, e.g. the first pressure $p_1$ may be increased to atmospheric pressure in step S4. If, however, the pressures are balanced in step S2 at essentially atmospheric pressure, the first pressure $p_1$ may be increased over atmospheric pressure in step S4, e.g. to 2 bar. The pressure difference determines, amongst other present forces, such as capillary forces, surface tension, or wetting forces, the amount of material which is pressed into the blind holes. Therefore, the amount of the material portions may be controlled by accordingly set the pressures $p_1$ and $p_2$. If the blind holes of the transfer board are at least partially filled with the material, the transfer board is extracted from the material bath in step S5. Furthermore, balancing the pressures in step S2 at essentially a vacuum permits a conduction of other process steps at atmospheric pressure.

In a variant VL, which is indicated by a dotted line, the transfer board is optionally cooled in a first instance in a step S6R. Hereby, the material in the blind holes may solidify. After that, the transfer board is positioned opposite to the target board, whereupon, provided that optional cooling has taken place, the transfer board may be heated in order to liquefy the material in the blind holes of the transfer board. In a step S6L, the material is then expelled in order to, concluding alternative VL, place the material onto the target board in a step S7. Optionally, in a step S6L a further pressure difference between the first pressure $p_1$ and the second pressure $p_2$ may be generated, so that the first pressure $p_1$ is lower than the second pressure $p_2$ and the material is expelled from the blind holes of the transfer board. Nevertheless, simply heating the transfer board may suffice to expel and place the material.

In a variant VR, which is illustrated by a dashed line, expelling is first carried out according to step S6L, whereupon positioning takes place in a step S6R in order to conclude alternative VR, again by means of step S7 of placing the material onto the target board. With regard to the options of alternative VR, reference is made to the options of alternative VL.

The preceding description only describes advantageous exemplary embodiments of the invention. The features disclosed therein and the claims and the drawings can, therefore, be essential for the realization of the invention in its various embodiments, both individually and in any combination.

While the foregoing is directed to embodiments of the present invention, other and further embodiments of this invention may be devised without departing from the basic scope of the invention, the scope of the present invention being determined by the claims that follow.

What is claimed is:

1. A method for placing material onto a target board by means of a transfer board having a surface including a plurality of blind holes, the method comprising:
   (A) immersing the surface of the transfer board including the plurality of blind holes into a material bath in an orientation such that each opening of each blind hole faces the material bath and each bottom of each blind hole is opposite each respective opening, the material bath comprising the material in liquid form, wherein a first pressure acts on the material bath and a second pressure acts in the blind holes, and the first pressure and the second pressure are substantially equal during immersion;
   (B) after immersion, generating and controlling a pressure difference between the first pressure acting on the material bath and the second pressure in the blind holes, the first pressure being higher than the second pressure, so that the blind holes of the transfer board are filled partially with the liquid material such that an unfilled volume remains in a bottom part of each blind hole adjacent the bottom of each blind hole, wherein generating and controlling the pressure after immersion is done by operation of a pressure setting unit and the controlled pressure difference determines the size of the unfilled volume;
   (C) extracting the transfer board from the material bath and maintaining the transfer board in the orientation such that the blind holes remain partially filled and the unfilled volume remains in the bottom part of each blind hole adjacent the bottom of each blind hole; and
   (D) positioning the surface of the transfer board including the plurality of blind holes above and opposite to the target board, the material being expelled from the blind holes, such that the material touches the target board.

2. The method according to claim 1, wherein step (D) comprises:
   expelling material from the blind holes of the transfer board, wherein pearl-shaped portions of the material are formed in the surroundings of the blind hole openings; and
   positioning of the transfer board opposite to the target board, wherein the pearl-shaped portions of the material touch the target board so that the material is placed onto the target board.

3. The method according to claim 1, wherein prior to the immersion the first pressure and the second pressure are essentially a vacuum.

4. The method according to claim 3, wherein the first pressure is less than 5 mbar.

5. The method according to claim 3, wherein the pressure difference is generated by increasing the first pressure to atmospheric pressure.

6. The method according to claim 3, wherein the pressure difference is generated by increasing the first pressure to essentially 1 bar.

7. The method according to claim 1, wherein prior to the immersion the first pressure and the second pressure essentially correspond to atmospheric pressure.

8. The method according to claim 7, wherein the pressure difference is generated by lowering the second pressure to a vacuum.

9. The method according to claim 7, wherein the pressure difference is generated by lowering the second pressure to less than 5 mbar.

10. The method according to claim 1, wherein the transfer board is heated prior to immersion.

11. A method for placing material onto a target board by means of a transfer board having a surface including a plurality of blind holes, the method comprising:
(A) immersing the surface of the transfer board including the plurality of blind holes into a material bath in an orientation such that each opening of each blind hole faces the material bath and each bottom of each blind hole is opposite each respective opening, the material bath comprising the material in liquid form, wherein a first pressure acts on the material bath and a second pressure acts in the blind holes, and the first pressure and the second pressure are substantially equal during immersion;
(B) after immersion, generating and controlling a pressure difference between the first pressure acting on the material bath and the second pressure in the blind holes, the first pressure being higher than the second pressure, so that the blind holes of the transfer board are filled partially with the liquid material such that an unfilled volume remains in a bottom part of each blind hole adjacent the bottom of each blind hole, wherein generating and controlling the pressure after immersion is done by operation of a pressure setting unit and the controlled pressure difference determines the size of the unfilled volume;
(C) extracting the transfer board from the material bath and maintaining the transfer board in the orientation such that the blind holes remain partially filled and the unfilled volume remains in the bottom part of each blind hole adjacent the bottom of each blind hole, wherein the liquid material in the blind holes is solidified after extracting the transfer board; and
(D) positioning the surface of the transfer board including the plurality of blind holes above and opposite to the target board, the material being expelled from the blind holes, such that the material touches the target board.

12. The method according to claim 11, wherein the liquid material is solidified by cooling.

13. The method according to claim 12, wherein the material is re-liquefied by heating prior to expelling the material.

14. A method for placing material onto a target board by means of a transfer board having a surface including a plurality of blind holes, the method comprising:
(A) immersing the surface of the transfer board including the plurality of blind holes into a material bath in an orientation such that each opening of each blind hole faces the material bath and each bottom of each blind hole is opposite each respective opening, the material bath comprising the material in liquid form, wherein a first pressure acts on the material bath and a second pressure acts in the blind holes, and the first pressure and the second pressure are substantially equal during immersion;
(B) after immersion, generating and controlling a pressure difference between the first pressure acting on the material bath and the second pressure in the blind holes, the first pressure being higher than the second pressure, so that the blind holes of the transfer board are filled partially with the liquid material such that an unfilled volume remains in a bottom part of each blind hole adjacent the bottom of each blind hole, wherein generating and controlling the pressure after immersion is done by operation of a pressure setting unit and the controlled pressure difference determines the size of the unfilled volume;
(C) extracting the transfer board from the material bath and maintaining the transfer board in the orientation such that the blind holes remain partially filled and the unfilled volume remains in the bottom part of each blind hole adjacent the bottom of each blind hole; and
(D) positioning the surface of the transfer board including the plurality of blind holes above and opposite to the target board, the material being expelled from the blind holes, such that the material touches the target board, wherein a further pressure difference between the second pressure in the blind holes and a third pressure outside of the blind holes is generated in order to expel material from the blind holes of the transfer board.

15. The method according to claim 14, wherein the further pressure difference is controlled so that the volume of the expelled material is determined in the surroundings of the blind hole openings.

16. The method according to claim 1, wherein the material is conductive.

17. The method according to claim 1, wherein the material is solder.

18. The method according to claim 17, wherein
the transfer board and the target board are substrates with contact pads,
the blind holes of the transfer board are arranged in the surroundings of the contact pads at a surface,
positioning of the transfer board opposite to the target board is carried out such that the contact pads of the transfer board and the contact pads of the target board are essentially facing each other, and
the expelling of the solder material from the blind holes is carried out in such a way that the solder material produces a connection between two opposite contact pads.

19. The method according to claim 1, wherein the pressure setting unit is one of a pump and a vacuum in fluid communication with an ambient environment of the material bath, whereby the first pressure acting on the material bath can be varied.

20. The method according to claim 1, wherein the pressure setting unit is one of a pump and a vacuum in fluid communication with an ambient environment of the material bath, whereby the first pressure acting on the material bath can be varied while the transfer board is held stationary in an immersed position in the material bath.

21. The method according to claim 1, wherein the pressure difference is generated by lowering the second pressure.

* * * * *